US007262449B2

(12) United States Patent
Kajiyama

(10) Patent No.: US 7,262,449 B2
(45) Date of Patent: Aug. 28, 2007

(54) MTJ ELEMENT FOR MAGNETIC RANDOM ACCESS MEMORY

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 10/847,362

(22) Filed: May 18, 2004

(65) Prior Publication Data

US 2005/0201147 A1 Sep. 15, 2005

(30) Foreign Application Priority Data

Mar. 12, 2004 (JP) ............................ 2004-071391

(51) Int. Cl.
*H01L 29/76* (2006.01)

(52) U.S. Cl. ...................... 257/295; 257/421; 257/422; 257/425; 257/427

(58) Field of Classification Search ................ 257/295, 257/421, 422, 425, 427
See application file for complete search history.

(56) References Cited

U.S. PATENT DOCUMENTS 6,430,085 B1 8/2002 Rizzo
6,548,849 B1 4/2003 Pan et al.
2006/0187705 A1* 8/2006 Nakamura et al. .......... 365/171

FOREIGN PATENT DOCUMENTS

JP 2002-289944 10/2002
JP 2003-249630 9/2003
JP 2003-332651 11/2003

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A magnetic random access memory according to an aspect of the present invention comprises a first magnetic layer in which a magnetization state is fixed, a second magnetic layer which has a shape different from that of the first magnetic layer and in which a magnetization state varies in accordance with write data, a non-magnetic layer which is arranged between the first magnetic layer and the second magnetic layer, and a third magnetic layer which surrounds the second magnetic layer.

14 Claims, 7 Drawing Sheets

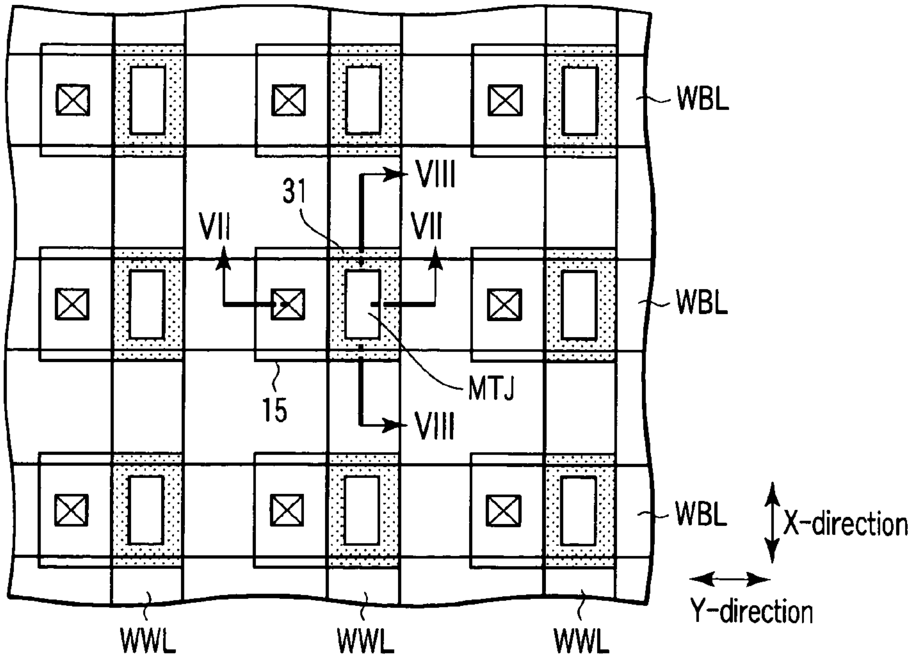
F I G. 6

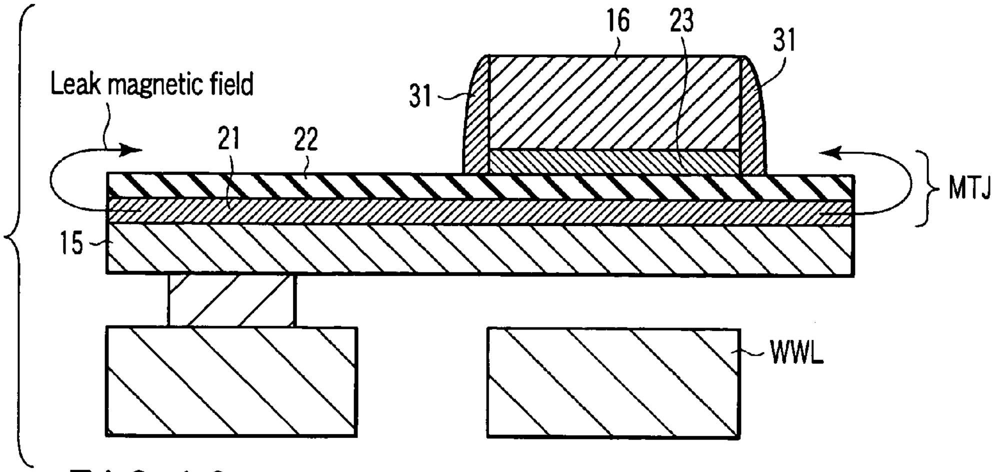
F I G. 1 2
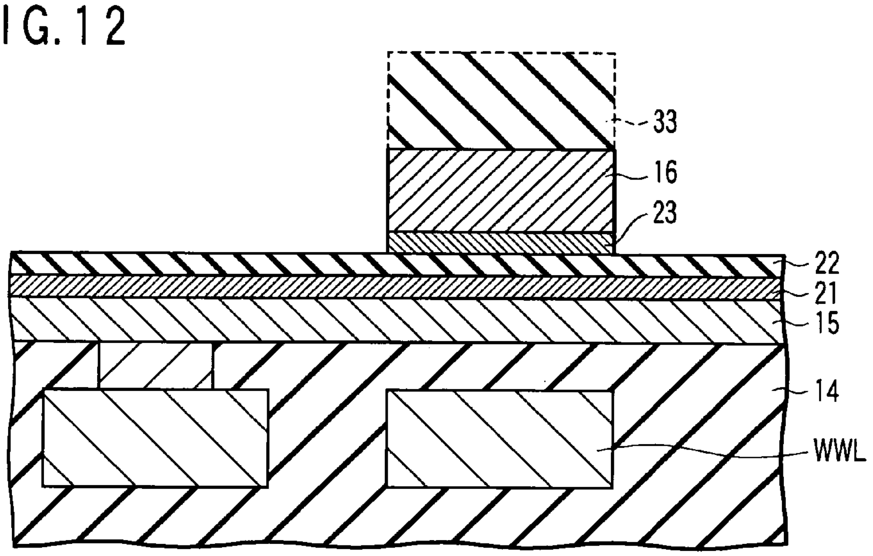
F I G. 1 3
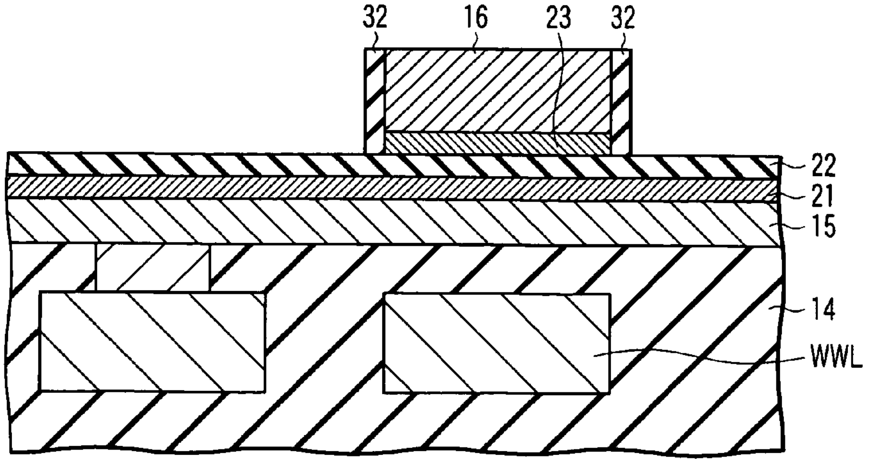
F I G. 1 4

MTJ ELEMENT FOR MAGNETIC RANDOM ACCESS MEMORY

CROSS-REFERENCE TO RELATED APPLICATIONS

This application is based upon and claims the benefit of priority from prior Japanese Patent Application No. 2004-071391, filed Mar. 12, 2004, the entire contents of which are incorporated herein by reference.

BACKGROUND OF THE INVENTION

1. Field of the Invention

The present invention relates to a magnetic random access memory (MRAM) which utilizes a magneto resistive effect.

2. Description of the Related Art

A magnetic random access memory which utilizes a tunneling magneto resistive effect (TMR) is characterized in that data is stored by using a magnetization state of an MTJ (Magnetic Tunnel Junction) element. This is described in, e.g., M. Durlam et al. "A low power 1 Mbit MRAM based on 1T1MTJ bit cell integrated with Copper Interconnects", IEEE, 2002 Symposium on VLSI Circuits Digest of Technical Papers.

FIG. shows an example of a device structure of a conventional random access memory. FIG. 2 is a cross-sectional view taken along the line II-II in FIG. 1, and FIG. 3 is a cross-sectional view taken along the line III-III in FIG. 1.

An element isolation layer 12 having an STI (shallow Trench Isolation) structure is formed in a P type silicon substrate 11. An N-channel MOS transistor as a read selection switch RSW is formed in an element area surrounded by the element isolation layer 12. A gate of this transistor functions as a read word line RWL and extends in, e.g., an X-direction.

A source area 13A of the N-channel MOS transistor as the read selection switch RSW is connected with a read bit line RBL. The read bit line RBL extends in, e.g., a Y-direction and is connected with a read circuit (including a sense amplifier). A drain area 13B of the N-channel MOS transistor is connected with an electroconductive layer (e.g., a metal layer) 15 arranged above this transistor.

An MTJ element MTJ is arranged on the electroconductive layer 15. A write word line WWL which extends in the X-direction is arranged directly below the MTJ element MTJ. The write word line WWL is separated from the MTJ element MTJ by a fixed distance. A write current which is directed toward one direction flows through the write word line WWL at the time of writing.

A cap layer 16 formed of a conductor is arranged on the MTJ element MTJ. The MTJ element MTJ and the cap layer 16 both have, e.g., a square shape or a rectangular shape which is long in the X-direction. Here, the X-direction is a direction parallel with a magnetization easy axis of the MTJ element MTJ, and the Y-direction is a direction parallel with a magnetization hard axis of the MTJ element MTJ. The MTJ element MTJ and the cap layer 16 are covered with an insulating layer 14.

A write bit line WBL which extends in the Y-direction is arranged on the cap layer 16. The write bit line WBL has a damascene wiring structure, i.e., a structure arranged in a wiring groove of the insulating layer 17.

The write bit line WBL is electrically connected with the MTJ element MTJ through the cap layer 16. Yoke layers 18 and 19 are arranged on a top surface and side surfaces of the write bit line WBL. A write current which is directed toward one direction or the other direction flows through the write bit line WBL in accordance with a value of write data.

A consideration will now be given as to the MTJ element MTJ.

Currently, as the MTJ element MTJ, various kinds of layer structures and shapes are examined in order to improve its properties. For example, there have been examined a bottom pin structure in which a free layer (recording layer) is arranged on a pin layer (fixed layer), a top pin structure in which the pin layer is arranged on the free layer and a crisscross as a shape of the MTJ element MTJ.

FIG. 4 shows an example of the MTJ element MTJ.

This MTJ element MTJ is characterized in that a pin layer 21, a tunnel insulating layer 22 and a free layer 23 have the same shape.

The MTJ element MTJ is arranged on the electroconductive layer 15, and the cap layer 16 is arranged on the MTJ element MTJ. The cap layer 16 also has the same shape as that of the MTJ element MTJ. The write word line WWL is arranged directly below the MTJ element MTJ.

In such an MTJ element MTJ, for example, after the cap layer 16 is patterned, the free layer 23, the tunnel insulating layer 22 and the pin layer 21 are continuously etched with this cap layer 16 being used as a mask.

In this case, however, since a thickness of the MTJ element MTJ is small, etching and re-deposition of the electroconductive layer (e.g., a metal layer) 15 which serves as a substrate are produced when patterning the MTJ element MTJ, and an electroconductive layer 24 may be formed on each side wall of the MTJ element MTJ due to this re-deposition in some cases.

This electroconductive layer 24 short-circuits the pin layer 21 and the free layer 23 of the MTJ element MTJ, which becomes a factor of a bit defect.

In order to solve this problem, an MTJ element MTJ based on a so-called barrier stop technique has been examined.

FIG. 5 shows an example of an MTJ element MTJ based on the barrier stop technique.

This MTJ element MTJ is characterized in that a pin layer 21 and a tunnel insulating layer 22 have the same shape and a free layer 23 whose shape is different from that of the pin layer 21 is arranged on the tunnel insulating layer 22.

For example, the pin layer 21 and the tunnel insulating layer 22 which have the same shape as that of an electroconductive layer 15 are arranged on the electroconductive layer 15. The free layer 23 whose shape is different from that of the pin layer 21 is arranged on the tunnel insulating layer 22. On the free layer 23 is arranged, e.g., a cap layer 16 having the same shape as that of the free layer 23. A write word line WWL is arranged directly below the MTJ element MTJ.

In such an MTJ element MTJ, since the free layer 23, the tunnel insulating layer 22 and the pin layer 21 are not continuously etched with the electroconductive layer 15 being used as a substrate, the problem of so-called re-deposition can be solved.

In the barrier stop technique, however, patterning of the free layer 23 and patterning of the pin layer 21 are carried out by using different masks with different timings, and hence an alignment error is necessarily produced between them. A quantity of this alignment error varies depending on each chip or each wafer.

On the other hand, in the MTJ element MTJ based on the barrier stop technique, the pin layer 21 becomes larger than the free layer 23, and an influence given on the free layer 23 by a leak magnetic field generated from the pin layer 21 cannot be ignored. However, since the influence given on the free layer 23 by the leak magnetic field varies depending on a positional relationship between the free layer 23 and the pin layer 21, when an alignment error is generated between the free layer 23 an the pin layer 21 as described above, magnetic properties of the MTJ element MTJ also vary in accordance with a quantity of alignment error.

That is, irregularities are produced in magnetic properties of the MTJ element MTJ due to the alignment error at the time of lithography, and it is hard to obtain the MTJ element MTJ having stable properties.

BRIEF SUMMARY OF THE INVENTION

A magnetic random access memory according to an aspect of the present invention comprises: a first magnetic layer in which a magnetization state is fixed; a second magnetic layer which has a shape different from that of the first magnetic layer and in which a magnetization state varies in accordance with write data; a non-magnetic layer arranged between the first magnetic layer and the second magnetic layer; and a third magnetic layer which surrounds the second magnetic layer.

A magnetic random access memory manufacturing method according to an aspect of the present invention comprises: a step of forming a non-magnetic layer on a first magnetic layer; a step of forming a second magnetic layer on the non-magnetic layer; a step of patterning the second magnetic layer by using a first mask; a step of forming a third magnetic layer which surrounds the second magnetic layer by using a side wall process; and a step of patterning the non-magnetic layer and the first magnetic layer by using a second mask.

BRIEF DESCRIPTION OF THE SEVERAL VIEWS OF THE DRAWING

FIG. 6 is a plane view showing a device structure according to an example of the present invention;

FIG. 12 is a cross-sectional view showing a fourth example of the layout of the magnetic shield layer;

FIG. 13 is a cross-sectional view showing a step in a manufacturing method according to an example of the present invention;

FIG. 14 is a cross-sectional view showing a step in the manufacturing method according to the example of the present invention;

DETAILED DESCRIPTION OF THE INVENTION

A magnetic random access memory of an aspect of the present invention will be described below in detail with reference to the accompanying drawings.

1. Device Structure

Figure 1:
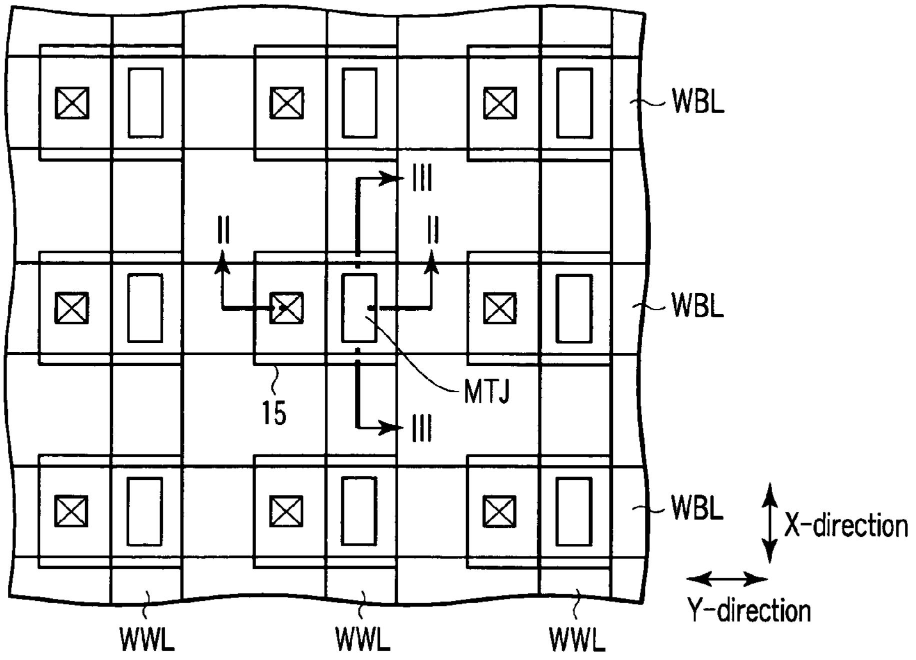
FIG. 1 is a plane view showing an example of a conventional device structure.
Figure 2:
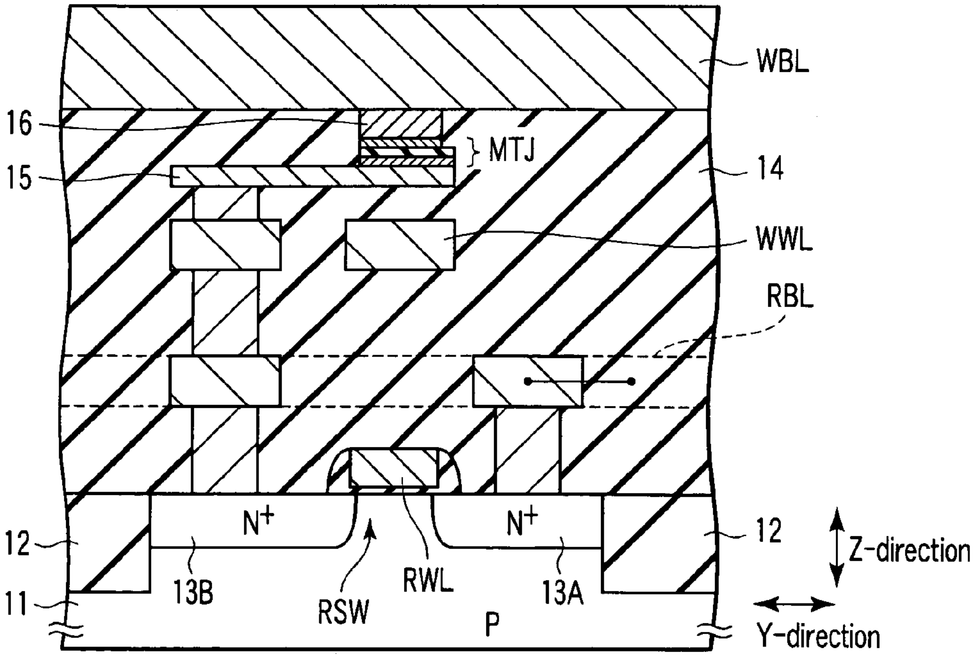
FIG. 2 is a cross-sectional view taken along the line II-II in FIG. 1.
Figure 3:
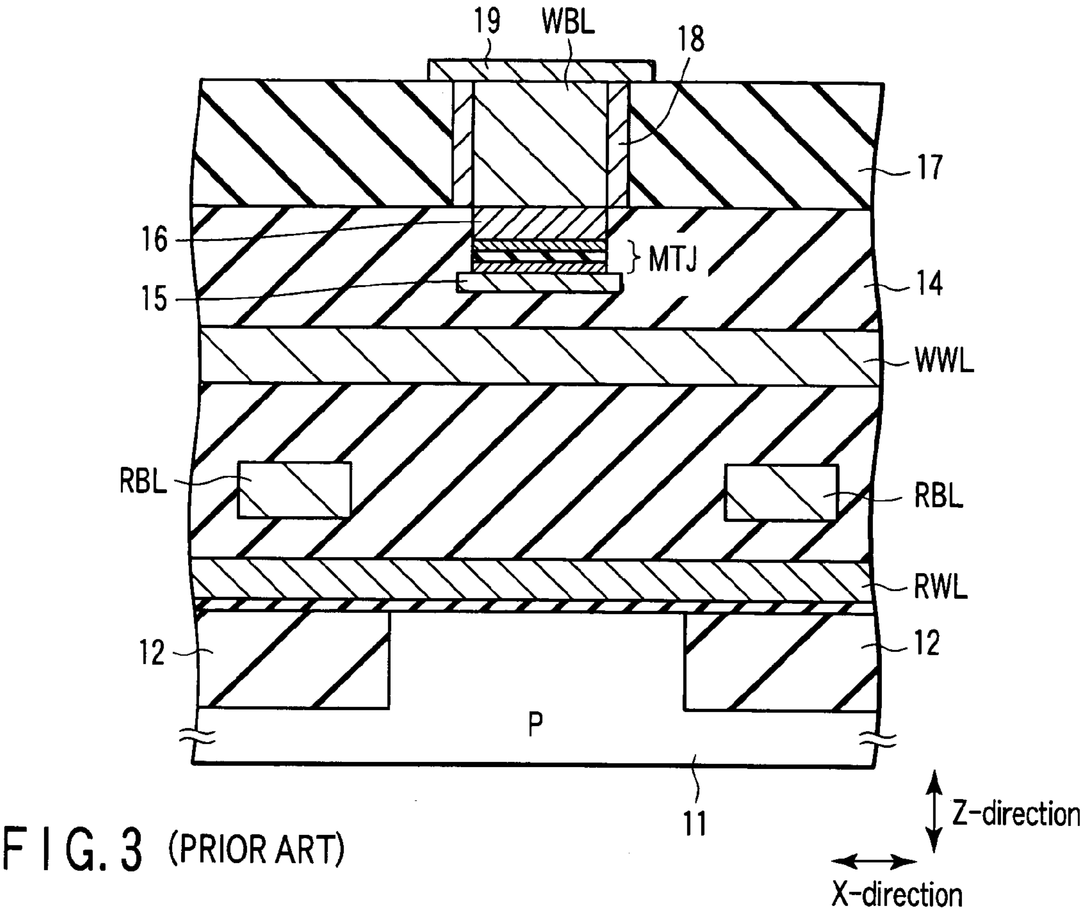
FIG. 3 is a cross-sectional view taken along the line III-III in FIG. 1.
Figure 4:
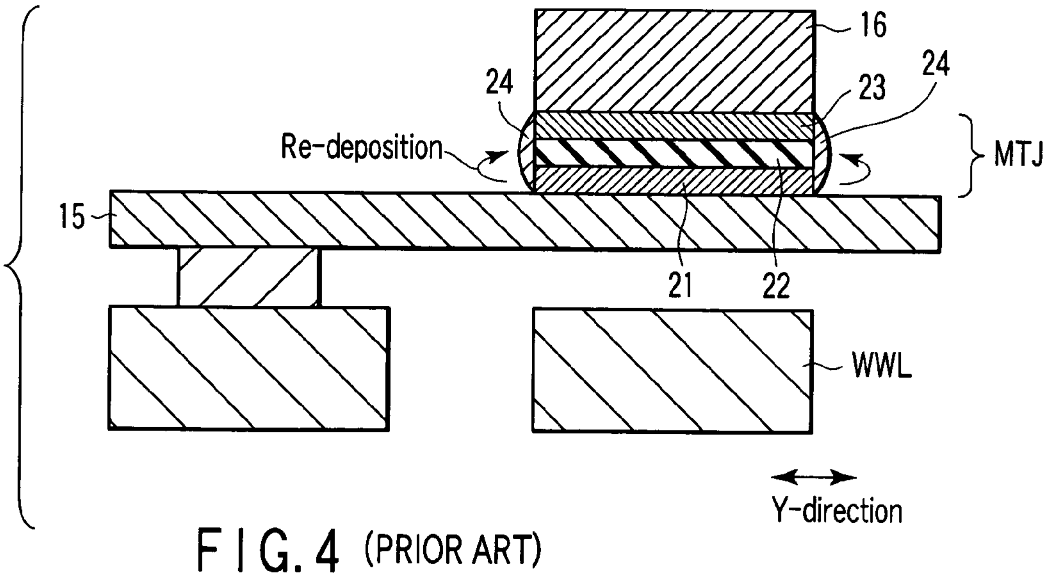
FIG. 4 is a cross-sectional view showing a problem in the conventional device structure.
Figure 5:
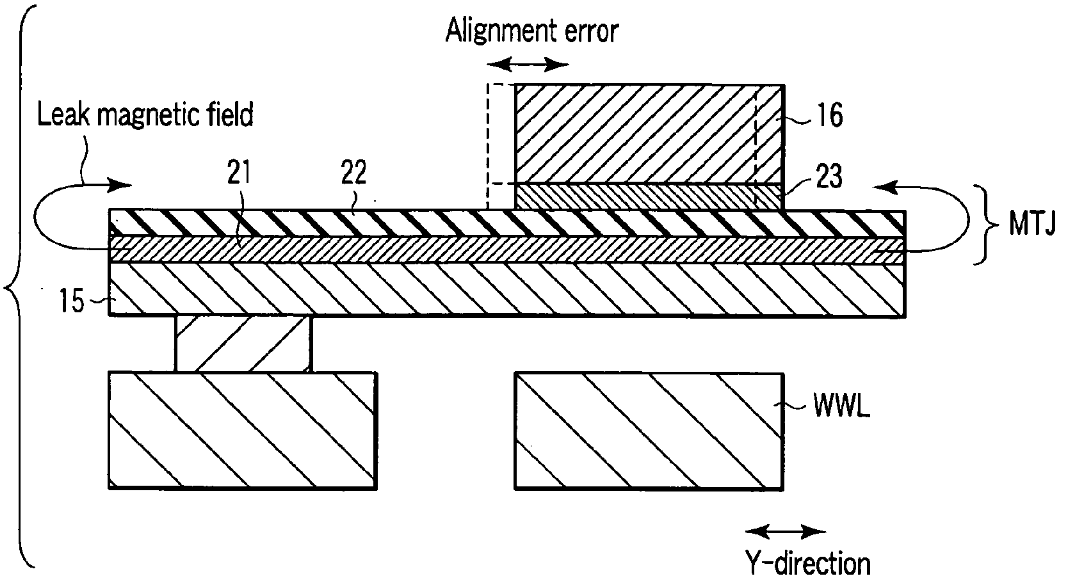
FIG. 5 is a cross-sectional view showing a problem in the conventional device structure.
Figure 7:
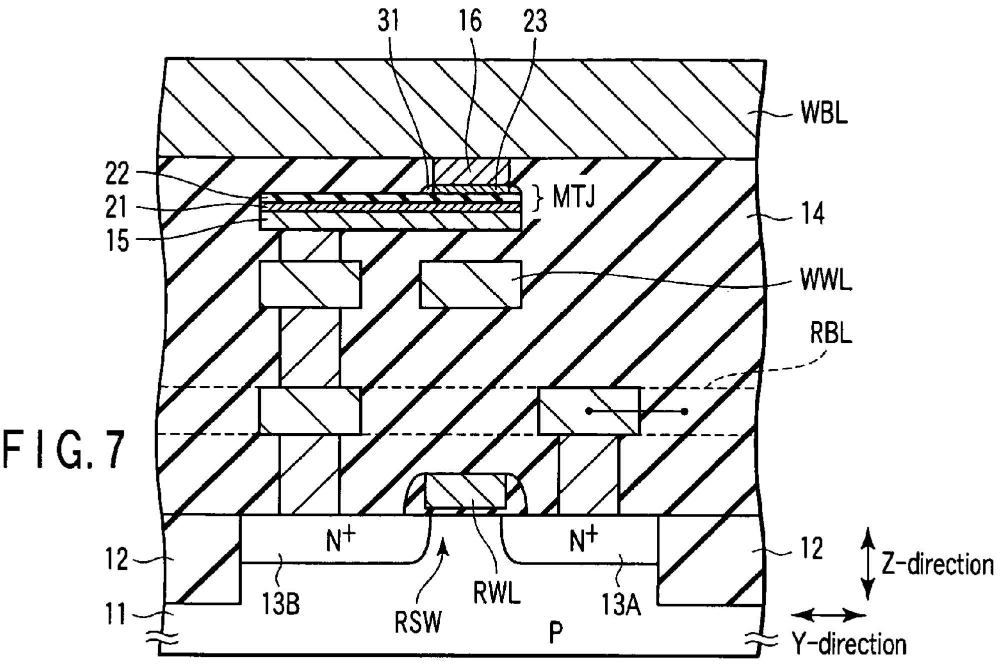
FIG. 7 is a cross-sectional view taken along the line VII-VII in FIG. 6.
Figure 8:
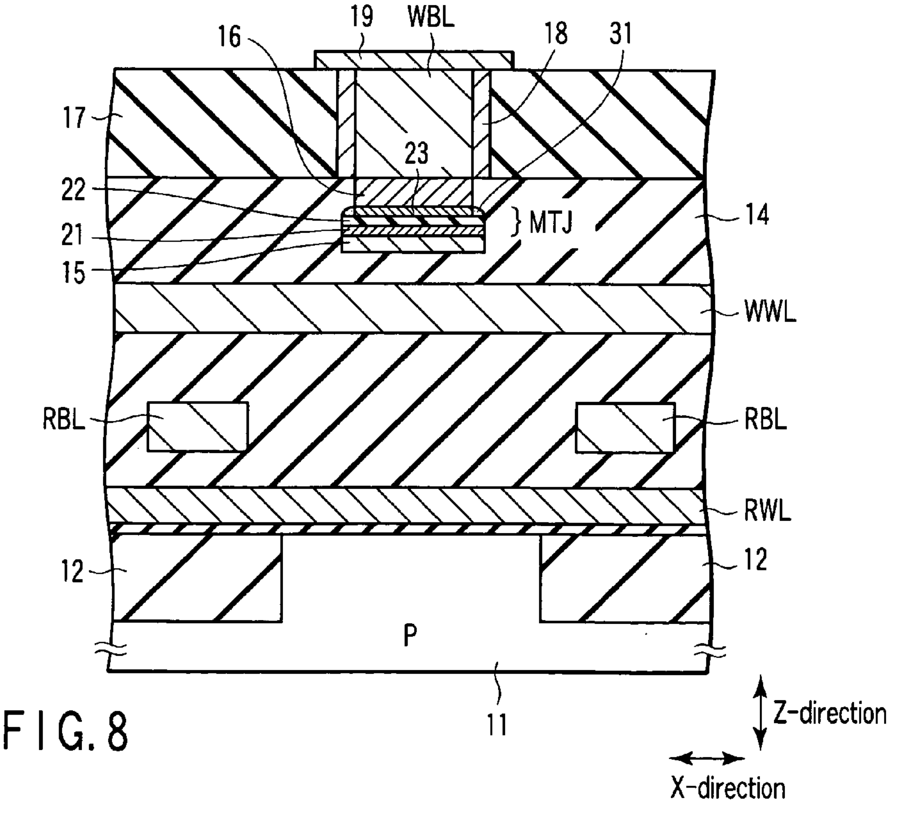
FIG. 8 is a cross-sectional view taken along the line VIII-VIII in FIG. 6.

FIG. 6 shows a device structure of a magnetic random access memory according to an example of the present invention. FIG. 7 is a cross-sectional view taken along the line VII-VII in FIG. 6, and FIG. 8 is a cross-sectional view taken along the line VIII-VIII in FIG. 6.

An element isolation layer 12 having an STI (Shallow Trench Isolation) structure is formed in a P type silicon substrate 11. An N-channel MOS transistor as a read selection switch RSW is formed in an element area surrounded by the element isolation layer 12. A gate of this transistor functions as a read word line RWL, and extends in, e.g., an X-direction.

A source area 13A of the N-channel MOS transistor as the read selection switch RSW is connected with a read bit line RBL. The read bit line RBL extends in, e.g., a Y-direction, and is connected with a read circuit (including a sense amplifier). A drain area 13B of the N-channel MOS transistor is connected with an electroconductive layer (e.g., a metal layer) 15 arranged above this transistor.

An MTJ element MTJ is arranged on the electroconductive layer 15. A write word line WWL which extends in the X-direction is arranged directly below the MTJ element MTJ. The write word line WWL is separated from the MTJ element MTJ by a fixed distance. A write current which is directed toward one direction flows through the write word line WWL at the time of writing.

A cap layer 16 formed of a conductor is arranged on the MTJ element MTJ. The MTJ element MTJ and the cap layer 16 both have, e.g., a square shape or a rectangular shape which is long in the X-direction. Here, the X-direction is a direction parallel with a magnetization easy axis of the MTJ element MTJ, and the Y-direction is a direction parallel with a magnetization hard axis of the MTJ element MTJ. The MTJ element MTJ and the cap layer 16 are covered with an insulating layer 14.

A write bit line WBL which extends in the Y-direction is arranged on the cap layer 16. The write bit line WBL has a damascene wiring structure, i.e., a structure arranged in a wiring groove of the insulating layer 17.

The write bit line WBL is electrically connected with the MTJ element MTJ through the cap layer 16. Yoke layers 18 and 19 are arranged on a top-surface and side surfaces of the write bit line WBL. A write current which is directed toward one direction or the other direction flows through the write bit line WBL in accordance with a value of write data.

A structure of the MTJ element MTJ according to the example of the present invention will now be described in detail.

In the example of the present invention, an MTJ element MTJ based on a barrier stop technique is adopted.

That is, in the MTJ element MTJ, a pin layer 21 and a-tunnel insulating layer 22 have the same shape and a free layer 23 whose shape is different from that of the pin layer 21 is arranged on the tunnel insulating layer 22.

For example, on the square electroconductive layer 15 are arranged the pin layer 21 and the tunnel insulating layer 22 which have the same shape as that of the electroconductive layer 15. Moreover, the free layer 23 whose shape is different from that of the pin layer 21 is arranged on the tunnel insulating layer 22. The free layer 23 has, e.g., a rectangular shape which is long in the X-direction. The cap layer 16 having the same shape as that of the free layer 23 is arranged on the free layer 23.

Additionally, in the example according to the present invention, in order to eliminate an influence given on the free layer 23 by a leak magnetic field generated from the pin layer 21, a magnetic layer 31 having a function to shield the leak magnetic field is arranged around the free layer 23, specifically so as to surround side surfaces of the free layer 23. The magnetic layer 31 is arranged on, e.g., the tunnel insulating layer 22.

According to such a device structure, at first, since the MTJ element MTJ based on the barrier stop technique is adopted, a problem of short-circuit of the MTJ element MTJ due to so-called re-deposition can be solved. Further, at second, a problem of the leak magnetic field from the pin layer 21 due to adoption of the barrier stop technique can be solved by arranging the magnetic layer 31 which shields the leak magnetic field around the free layer 23.

Therefore, according to the example of the present invention, even if irregularities are produced in a positional relationship between the free layer 23 and the pin layer 21 in each chip or each wafer due to the alignment error at the time of lithography, the MTJ element MTJ having stable magnetic properties can be obtained.

2. Layout Examples of Magnetic Layer as Magnetic Shield Layer

A description will now be given as to some layout examples of the magnetic layer (magnetic shield layer) which shields the leak magnetic field from the pin layer.

Figure 9:
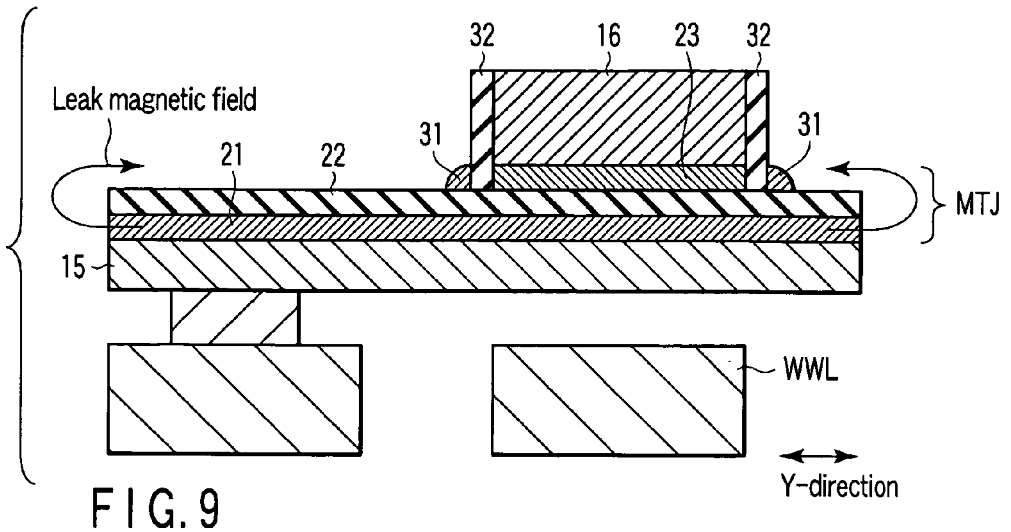
FIG. 9 is a cross-sectional view showing a first example of a layout of a magnetic shield layer.

FIG. 9 shows a first example of the layout of the magnetic shield layer.

In this example, the magnetic layer 31 having a function to shield the leak magnetic field from the pin layer 21 are arranged so as to surround side surfaces of the free layer 23. Furthermore, each insulating layer (e.g., silicon oxide) 32 which separates the free layer 23 and the magnetic layer 31 from each other is arranged between them.

An advantage of arranging the insulating layer 32 lies in that a positional relationship between the free layer 23 and the magnetic layer 31 can be adjusted by using a thickness (width in the Y-direction) of the insulating layer 32. That is, forming a fixed space between the free layer 23 and the magnetic layer 31 can give the magnetic layer 31 a function to shield the leak magnetic field from the pin layer 21 as well as a function to cause a magnetic field from, e.g., the write word/bit line to efficiently act on the free layer 23 without shielding this magnetic field.

Incidentally, it is preferable for the magnetic layers 31 to cover the entire side surfaces of the free layer 23, but even a case that the magnetic layers 31 partially cover the side surfaces of the free layer 23 is included in the category of the example according to the present invention as long as it has the function to shield the leak magnetic field.

Figure 10:
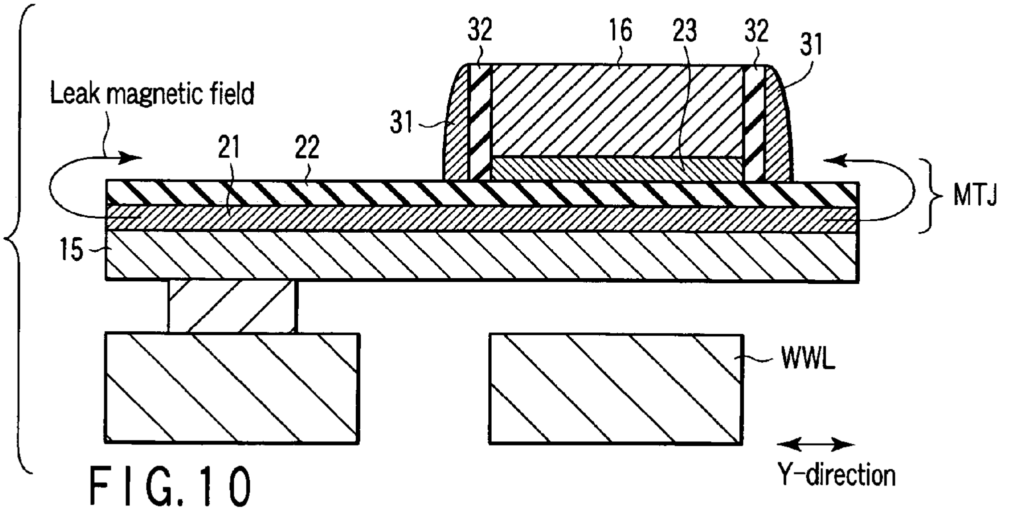
FIG. 10 is a cross-sectional view showing a second example of the layout of the magnetic shield layer.

FIG. 10 shows a second example of the layout of the magnetic shield layer.

In this example, the magnetic layers 31 having the function to shield the leak magnetic field from the pin layer 21 are arranged so as to surround side surfaces of the free layer 23 and side surfaces of the cap layer 16. An effect of this example lies in that the magnetic layers 31 may cover not only the side surfaces of the free layer 23 but also any other parts.

It is to be noted that arranging each insulating layer (e.g., silicon oxide) which separates the free layer 23 and the magnetic layer 31 from each other between these layers is the same as that in the first example.

Figure 11:
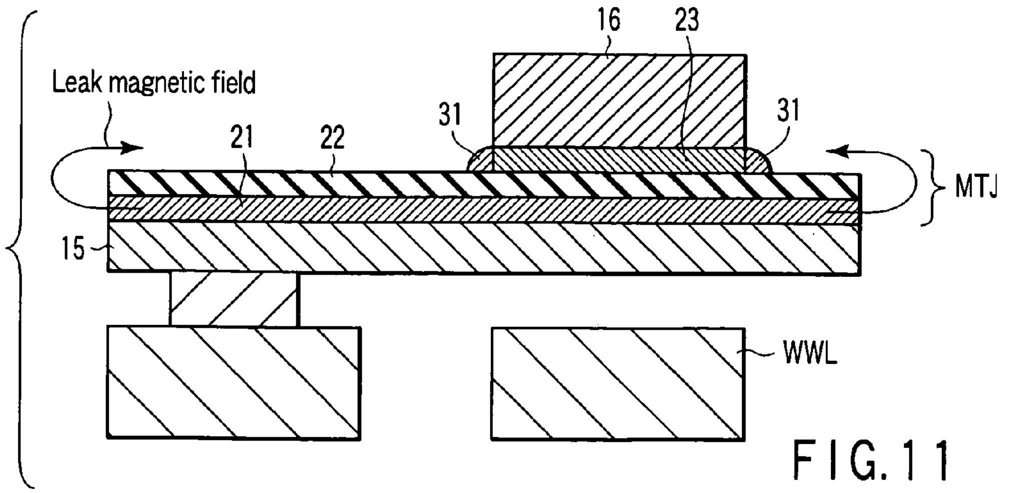
FIG. 11 is a cross-sectional view showing a third example of the layout of the magnetic shield layer.

FIG. 11 shows a third example of the layout of the magnetic shield layer.

This example is a modification of the first example, and it is different from the first example in that each insulating layer which separates the free layer 23 and the magnetic layer 31 from each other does not exist between them and each magnetic layer 31 is in contact with the free layer 23.

In the layout of this example, since the magnetic layers 31 are arranged so as to surround the side surfaces of the free layer 23, the function to shield the leak magnetic field from the pin layer 21 is the same as compared with the first example.

Furthermore, the magnetic layers 31 may cover the entire side surfaces of the free layer 23 or may partially cover the side surfaces of the free layer 23 like the first example.

FIG. 12 shows a fourth example of the layout of the magnetic shield layer.

This example is a modification of the second example, and it is different from the second example in that each insulating layer which separates the free layer 23 and the magnetic layer 31 from each other does not exist between these layers and each magnetic layer 31 is in contact with the free layer 23. Any other point is the same as that in the second example.

In the layout of this example, since the magnetic layers 31 are arranged so as to surround the side surfaces of the free layer 23, the function to shield the leak magnetic field from the pin layer 21 is the same as compared with the second example.

3. Manufacturing Method

A magnetic random access memory manufacturing method according to an example of the present invention will now be described taking an adoption of the MTJ element depicted in FIG. 9 as an example.

Here, a description will be given as to a process to form the MTJ element which is a characteristic part in the magnetic random access memory according to the example of the present invention, and an explanation about preceding and subsequent processes will be eliminated.

First, as shown in FIG. 13, an electroconductive layer (e.g., a metal layer) 15 is formed on a flattened insulating layer 14 by using, e.g., a sputtering method or a CVD method. Then, a magnetic layer (pin layer) 21, a non-magnetic layer (tunnel insulating layer) 22, a magnetic layer (free layer) 23 and a cap layer (conductor) 16 are sequentially formed on the electroconductive layer 15 by using, e.g., the sputtering method or the CVD method.

Moreover, a resist mask 33 is formed on the cap layer 16 by PEP (Photo Engraving Process). Then, the cap layer 16 is patterned by RIE (Reactive Ion Etching) with this resist mask 33 being used as a mask. Thereafter, the resist mask 33 is removed by ashing.

Additionally, the magnetic layer 23 is etched by RIE with a hard mask formed of the cap layer 16 being used as a mask, and it is formed into a free layer.

Then, as shown in FIG. 14, side walls formed of insulating layers (e.g., silicon oxide) 32 are formed on side walls of the free layer 23 and side walls of the cap layer 16 by a side wall process.

Specifically, the insulating layers 32 are formed on the non-magnetic layer 22 and the cap layer 16 by using, e.g., the CVD method. Thereafter, the insulating layers 32 are etched by RIE, and the insulating layers 32 are left on the side walls of the free layer 23 and the side walls of the cap layer 16.

Figure 15:
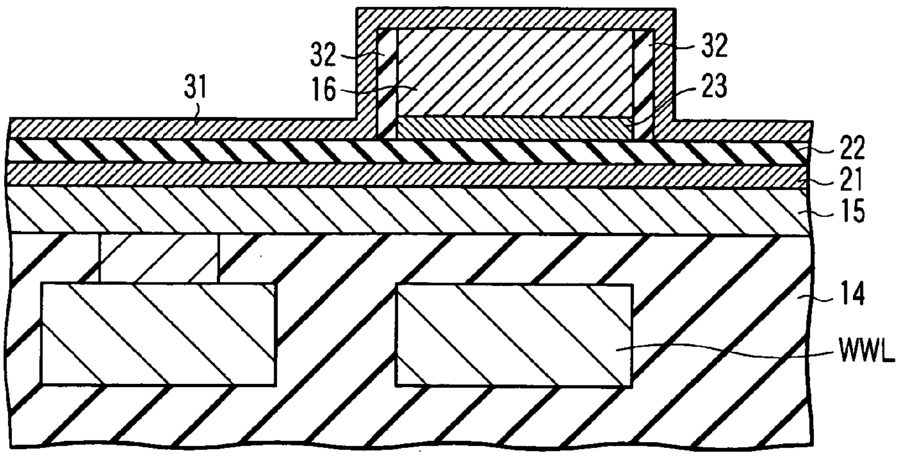
FIG. 15 is a cross-sectional view showing a step in the manufacturing method according to the example of the present invention.
Figure 16:
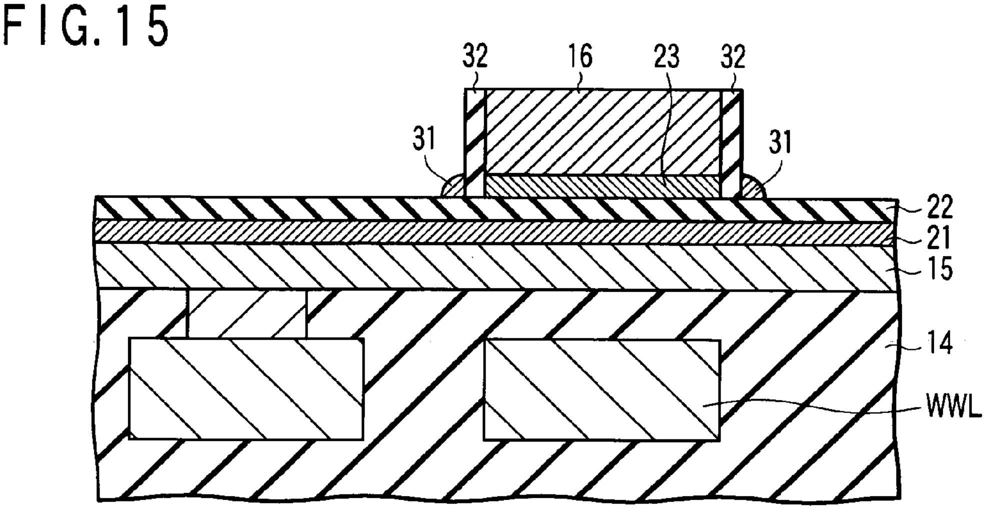
FIG. 16 is a cross-sectional view showing a step in the manufacturing method according to the example of the present invention.

Then, as shown in FIGS. 15 and 16, a magnetic layer 31 having a function as a magnetic shield layer is formed on side walls of the insulating layers 32 by the side wall process.

Specifically, as shown in FIG. 15, the magnetic layer 31 is formed on the non-magnetic layer 22, the insulating layers 32 and the cap layer 16 by using, e.g., the CVD method. Thereafter, as shown in FIG. 16, the magnetic layer 31 is etched by RIE, and the magnetic layer 31 is caused to remain so as to surround side surfaces of the free layer 23.

Here, in regard to etching of the magnetic layer 31, a residual quantity of the magnetic layer 31 can be controlled by adjusting an etching quantity. For example, as shown in FIG. 16, leaving the magnetic layer 31 so as to surround only the side surfaces of the free layer 23 can obtain the MTJ element depicted in FIG. 9, and leaving the magnetic layer 31 so as to surround the side surfaces of the free layer 23 and the side surfaces of the cap layer 16 can obtain the MTJ element illustrated in FIG. 10.

It is to be noted that the magnetic layer 31 is arranged in order to shield an unnecessary magnetic field which varies properties of the MTJ element, e.g., a leak magnetic field from the pin layer. Therefore, the magnetic layer 31 is constituted of a material having magnetic properties different from those of the pin layer or the free layer.

Figure 17:
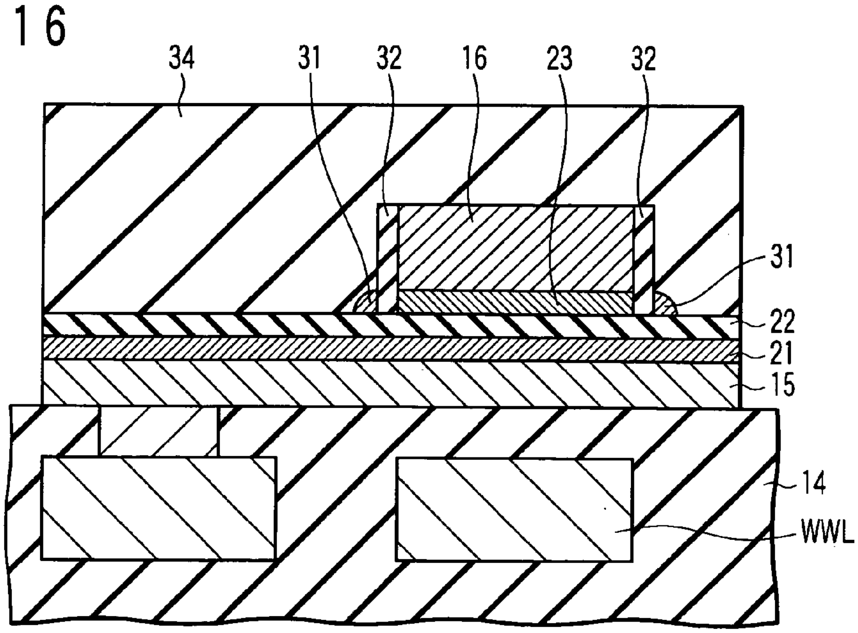
FIG. 17 is a cross-sectional view showing a step in the manufacturing method according to the example of the present invention.

Then, as shown in FIG. 17, a resist mask 34 is formed on the non-magnetic layer 22, the insulating layers 32, the cap layer 16 and the magnetic layers 31 by PEP. Then, the non-magnetic layer 22, the magnetic layer 21 and the electroconductive layer 15 are continuously etched by RIE with this resist mask 34 being used as a mask. As a result, the magnetic layer 21 becomes the pin layer, and the non-magnetic layer 22 becomes the tunnel insulating layer.

Thereafter, the resist mask 34 is removed by ashing.

The MTJ element such as shown in FIG. 9 is brought to completion by the above-described process.

Meanwhile, the insulating layer 32 is arranged between the free layer 23 and the magnetic layer 21 in order to assure a fixed distance between them in this example, eliminating the process to form this insulating layer 32 can easily obtain the MTJ element depicted in FIG. 11 or FIG. 12.

According to such a manufacturing method, the magnetic layer 31 as the magnetic shield layer can be formed by using the side wall process based on self-alignment. As a result, even if an alignment error is produced at the time of lithography of the resist masks 33 and 34, irregularities in magnetic properties of the MTJ element are not generated due to this alignment error.

4. Others

The magnetic random access memory according to the example of the present invention can be applied to a unit memory in which only a memory function is formed in a chip as well as an LSI in which both a memory function and a logic function (calculation, control and others) are formed in a chip.

Additionally, the example of the present invention is not restricted to layer structures or shapes of the MTJ element, and it can be applied to various kinds of MTJ elements.

For example, the example according to the present invention can be also applied to a magnetic random access memory having an MTJ element with a top pin structure as well as an MTJ element with a bottom pin structure, and it can be likewise applied to a magnetic random access memory having a cruciform MTJ element.

Further, although the description has been given as to a cell array structure which is of a one-transistor/one-MTJ type in the foregoing example, the magnetic random access memory according to the example of the present invention can be applied to a cell array structure which is of any other type, e.g., a cell array structure which is of, e.g., a one-transistor/n(n is a plural number)MTJ type, a ladder type, a lamination type, a cross point type or the like.

According to the example of the present invention, by surrounding the free layer with the magnetic layer having the magnetic shield function, an influence given on the free layer by the leak magnetic field from the pin layer can be eliminated, and hence the MTJ element with constantly stable magnetic properties can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MTJ element for a random access memory, comprising:
- a first magnetic layer in which a magnetization state is fixed;
- a second magnetic layer which has a shape different from that of the first magnetic layer and in which a magnetization state varies in accordance with write data;
- a non-magnetic layer which is arranged between the first magnetic layer and the second magnetic layer; and
- a third magnetic layer which surrounds all side surfaces of the second magnetic layer and does not surround side surfaces of the first magnetic layer,
- wherein the first magnetic layer, the second magnetic layer, and the non-magnetic layer are contiguous with each other.

2. The MTJ element according to claim 1, further comprising an insulating layer which is arranged between the second magnetic layer and the third magnetic layer and separates them from each other.

3. The MTJ element according to claim 1, wherein the third magnetic layer is in contact with the second magnetic layer.

4. The MTJ element according to claim 1, wherein the first magnetic layer and the non-magnetic layer have the same shape, and the second magnetic layer is arranged on the non-magnetic layer.

5. The MTJ element according to claim 1, wherein the first magnetic layer has a square shape, and the second magnetic layer is arranged on the non-magnetic layer and has a square shape smaller than that of the first magnetic layer.

6. The MTJ element according to claim 5, wherein the third magnetic layer is arranged on the non-magnetic layer and surrounds side surfaces of the second magnetic layer.

7. The MTJ element according to claim 6, further comprising an insulating layer which is arranged between the second magnetic layer and the third magnetic layer and separates them from each other.

8. The MTJ element according to claim 7, further comprising a cap layer which is arranged on the second magnetic layer, wherein the insulating layer is formed on the second magnetic layer and side walls of the cap layer.

9. The MTJ element according to claim 8, wherein the third magnetic layer surrounds only side surfaces of the second magnetic layer.

10. The MTJ element according to claim 8, wherein the third magnetic layer surrounds side surfaces of the second magnetic layer and side surfaces of the cap layer.

11. The MTJ element according to claim 6, wherein the third magnetic layer is in contact with the second magnetic layer, and surrounds only side surfaces of the second magnetic layer.

12. The MTJ element according to claim 6, further comprising a cap layer which is arranged on the second magnetic layer, wherein the third magnetic layer is in contact with the second magnetic layer and surrounds side surfaces of the second magnetic layer and side surfaces of the cap layer.

13. The MTJ element according to claim 1, further comprising an MOS transistor which is arranged directly below the first magnetic layer, the second magnetic layer and the non-magnetic layer.

14. The MTJ element according to claim 1, wherein the third magnetic layer comprises a material having magnetic properties different from those of the first magnetic layer and the second magnetic layer.

* * * * *